United States Patent
Ogura et al.

[11] Patent Number: 5,858,463
[45] Date of Patent: Jan. 12, 1999

[54] METHOD OF REGENERATING EXTRUSION DIE FOR CERAMIC HONEYCOMB STRUCTURAL BODIES

[75] Inventors: Yutaka Ogura, Nagoya; Kenji Nakano, Tokai; Kazuo Suzuki, Inazawa, all of Japan

[73] Assignee: NGK Insulators, Ltd., Japan

[21] Appl. No.: 720,972

[22] Filed: Oct. 16, 1996

[30] Foreign Application Priority Data

Oct. 17, 1995 [JP] Japan .................. 7-293379

[51] Int. Cl.$^6$ .................. C23C 16/30; B05D 3/10
[52] U.S. Cl. .................. 427/255; 427/249; 427/307; 427/309
[58] Field of Search .................. 427/249, 307, 427/309

[56] References Cited

U.S. PATENT DOCUMENTS

| | | | |
|---|---|---|---|
| 3,656,995 | 4/1972 | Reedy, Jr. | 427/249 |
| 4,066,821 | 1/1978 | Cook et al. | 427/249 |
| 4,574,459 | 3/1986 | Peters | 425/462 |
| 4,990,372 | 2/1991 | Sunder et al. | 427/249 |
| 5,236,740 | 8/1993 | Peters et al. | 427/249 |
| 5,256,449 | 10/1993 | Suzuki et al. | |
| 5,419,927 | 5/1995 | Dietrich | 427/309 |

FOREIGN PATENT DOCUMENTS

| | | |
|---|---|---|
| 017 387 | 10/1980 | European Pat. Off. . |
| 674 018 | 9/1995 | European Pat. Off. . |
| 3-281306 | 12/1991 | Japan . |
| 5-269719 | 10/1993 | Japan . |
| 7-256618 | 10/1995 | Japan . |
| 2 127 042 | 4/1984 | United Kingdom . |

*Primary Examiner*—Shrive P. Beck
*Assistant Examiner*—Bret Chen
*Attorney, Agent, or Firm*—Parkhurst & Wendel

[57] ABSTRACT

A method for regenerating an extrusion die for ceramic honeycomb structural bodies. The extrusion die includes a base metal and a titanium-based hard coating of an abrasion-resistant material which is formed on a surface of the base metal. The extrusion die is immersed in a solution of nitric acid when it has worn, so as to remove a residue of the hard coating from the surface of the base metal. Subsequently, a titanium-based fresh hard coating is formed on the surface of the base metal, and a pattern adjustment of the die is then performed wherein the surface of the fresh hard coating is locally ground so that the sliding resistance of the raw ceramic material becomes substantially uniform over the entire region of the die.

4 Claims, 18 Drawing Sheets

FIG_1
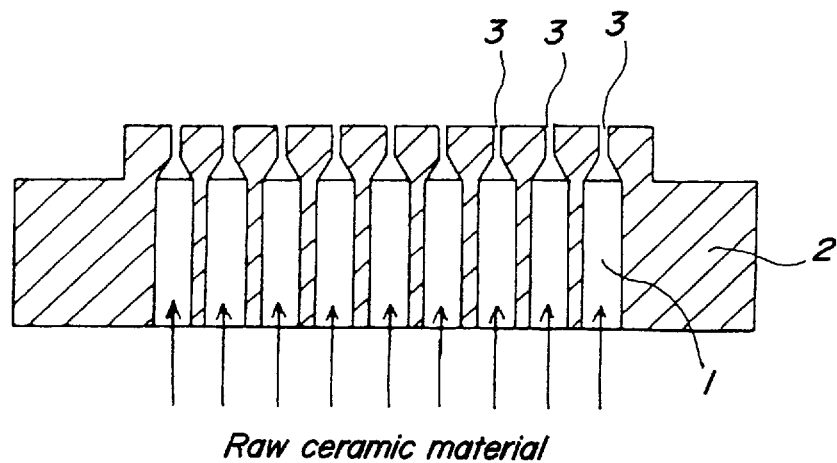
Raw ceramic material
FIG_2
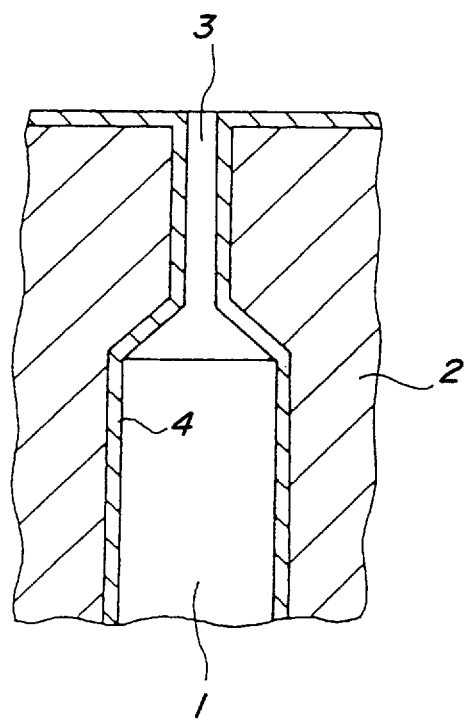

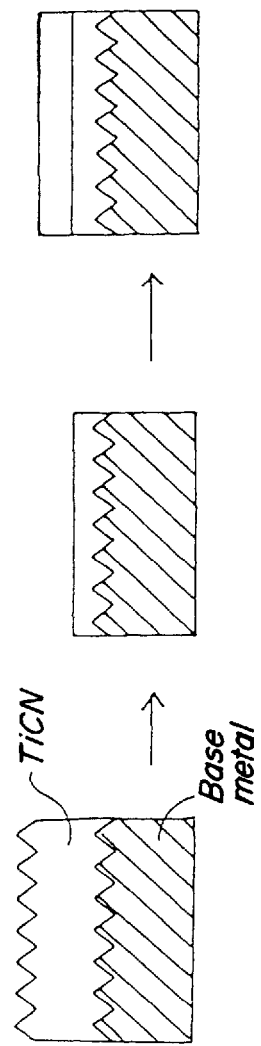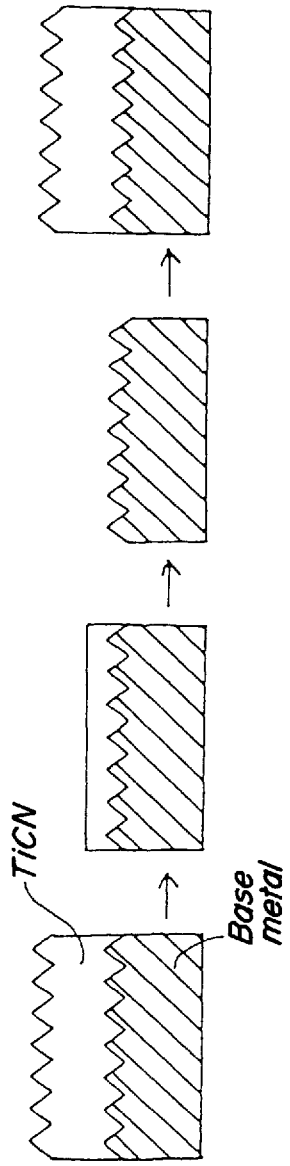

METHOD OF REGENERATING EXTRUSION DIE FOR CERAMIC HONEYCOMB STRUCTURAL BODIES

BACKGROUND OF THE INVENTION

1. Field of the Invention

The present invention relates to a method of regenerating an extrusion die for ceramic honeycomb structural bodies.

2. Statement of Related Art

As known in the art, ceramic honeycomb structural bodies are widely used in various fields, for example, as catalytic carriers for clarifying exhaust gas from internal combustion engines, as filters for removing particles from exhaust gas of diesel engines, and also as rotary-type heat exchanges. An extrusion die for extruding such ceramic honeycomb structural bodies is typically manufactured by a method wherein a hard coating comprising titanium as a major component, such as a TiCN coated layer, is formed on the surface of the base metal which is comprised of a martensite series precipitation-hardened stainless steel, by a hot CVD (chemical vapor deposition) process, as disclosed in JP-A-3-281,306 and JP-A-5-269,719 (or U.S. Pat. No. 5,256,449). The hard coating so formed serves to suppress abrasion of the die as the ceramic raw material or "body" is passed therethrough, and allows the die to be used for a prolonged period.

With reference, for example, to an extrusion die for extruding a cordierite honeycomb structural bodies having an outer diameter of 118 mm, a cell density of 400 cells per square inch and a wall thickness of 0.15 mm, as shown in FIG. 1, approximately 3,400 feeding holes 1 are formed in the base metal member 2 of the die, and each feeding hole 1 is aligned with a shaping orifice 3 and has an inner diameter of 1.0–1.5 mm and a depth of 18–36 mm. The shaping orifice 3 determines the cross-sectional shape of each cell in the honeycomb structural body. Thus, the shaping orifice 3 in the cross-section of the die is typically of a polygonal shape, e.g., a triangular, square or hexagonal shape, or of a circular shape.

FIG. 2 is an enlarged sectional view of a part of the extrusion die and illustrates a state in which the surface of the feeding hole 1 and the orifice 3 to be brought into contact with the raw ceramic material is uniformly formed with a hard coating 4 which comprises titanium as a major component. However, even an extrusion die provided with a hard coating of the above-mentioned abrasion-resistant material undergoes a progressive wear after a long period of use so that the thickness of the hard coating decreases gradually. Moreover, the amount of wear is more significant in the center region of the die, and less significant in the peripheral region thereof. Continued use of an extrusion die exhibiting a non-uniform wear amount often results in undesirable non-uniformity of the wall thickness of the honeycomb structural bodies as they are extruded form such a die, thereby giving rise to inferior product quality.

To overcome such a problem, the inventors developed and previously proposed a method wherein the peripheral region of the die exhibiting less significant wear amount is applied with a masking, and a fresh hard coating comprising titanium as a major component is then applied to the unmasked center region of the die exhibiting a significant wear amount, so as to regenerate a hard coating to have a uniform thickness over the entire region of the die, as fully disclosed in JP-A-7-256,618. This method proved to be useful effectively to regenerate worn extrusion dies so that ceramic honeycomb structural bodies extruded from such regenerated dies are substantially free from rough surface formation in their peripheral regions, thereby achieving an improved uniformity in terms of wall thickness of the honeycomb structure.

DETAILED DESCRIPTION OF THE INVENTION

It is a primary object of the present invention to provide an improved method for regenerating an extrusion die for ceramic honeycomb structural bodies, which allows the extrusion dies to be even more effectively regenerated with a higher degree of regeneration yield.

The present invention is based on a recognition obtained from thorough research and investigations based on the regeneration method according to the inventors' earlier proposal as discussed above. More particularly, it has been a customary practice that the extrusion die formed with a regenerated hard coating is put into practical use after it has been subjected to a so-called pattern adjustment, in which the hard coating is locally ground to provide a uniform sliding resistance over the entire region of the die as the raw ceramic material is passed through the shaping orifices of the die. On such occasion, the machinability of the hard coating depends not only on the hardness but also on the surface roughness of the coating which, in turn, depends on that of the base material.

In the case of a typical extrusion die for ceramic honeycomb structural bodies, the surface roughness Ra of the hard coating at the feeding hole or shaping orifice is on the order of 1.5 $\mu$m in the initial stage of use of the die, as shown in FIG. 3($a$). However, due to a continued use of the die and a resultant surface wear, the surface roughness Ra is gradually reduced to as low as 0.2 $\mu$m, as shown in FIG. 3($b$), which is nearly on the same order as a mirror-polished surface. Therefore, when the method according to the applicant's earlier proposal is applied to form a fresh hard coating is formed on a worn and smooth surface region of the previous coating, the fresh coating also has a surface roughness which is on the order of 0.2 $\mu$m, as shown in FIG. 3($c$).

This led to still another problem that a smooth surface of the fresh hard coating on the previous coating is relatively difficult to grind for a pattern adjustment to be properly performed, due mainly to its insufficient roughness. It has been found in this connection that such a machining difficulty often results in that ceramic honeycomb structural bodies extruded from the regenerated dies tend to be curved as a result of local difference in the sliding resistance of the raw ceramic material, and further that approximately 30% of the regenerated dies may exhibit more or less defective surfaces, as the case may be.

The present invention has been conceived with an objective to overcome such a difficulty in a simple though highly reliable manner.

Briefly stated, the present invention provides a method for regenerating an extrusion die for ceramic honeycomb structural bodies, wherein the extrusion die is comprised of a base metal and a hard coating of an abrasion-resistant material which is formed on a surface of the base metal, wherein the hard coating is comprised of titanium as a major component. According to the present invention, an extrusion die which has worn is immersed in a solution of nitric acid so as to remove a residual part of the hard coating from the surface of the base metal. A fresh hard coating comprising titanium as a major component is then formed on the surface of the base metal, and a pattern adjustment operation of the die is subsequently carried out.

Advantageously, the hard coating comprises at least one layer which essentially consists of a member selected from the group consisting of TiC, TiCN and TiN. In this instance, the hard coating is preferably formed by a CVD process.

Also advantageously, the base metal of the die comprises a precipitation-hardened stainless steel, and the solution has a nitric acid concentration which is within a range of 60–70%.

For a better understanding, the present invention will now be more fully explained below with reference to the drawings.

BRIEF DESCRIPTION OF THE DRAWINGS

FIG. 1 is a sectional view schematically showing the extrusion die for honeycomb structural bodies, to which the present invention is applied;

FIG. 2 is a fragmentary sectional view, in enlarged scale, showing a part of the extrusion die;

FIGS. 3(a), 3(b) and 3(c) are sectional views schematically showing the surface region of the extrusion die having a hard coating to be regenerated by the method according to the applicant's earlier proposal;

FIGS. 4(a), 4(b), 4(c) and 4(d) are sectional views schematically showing the surface region of the extrusion die having a hard coating to be regenerated by the method according to the present invention;

DETAILED DESCRIPTION OF THE INVENTION

Figure 5A:
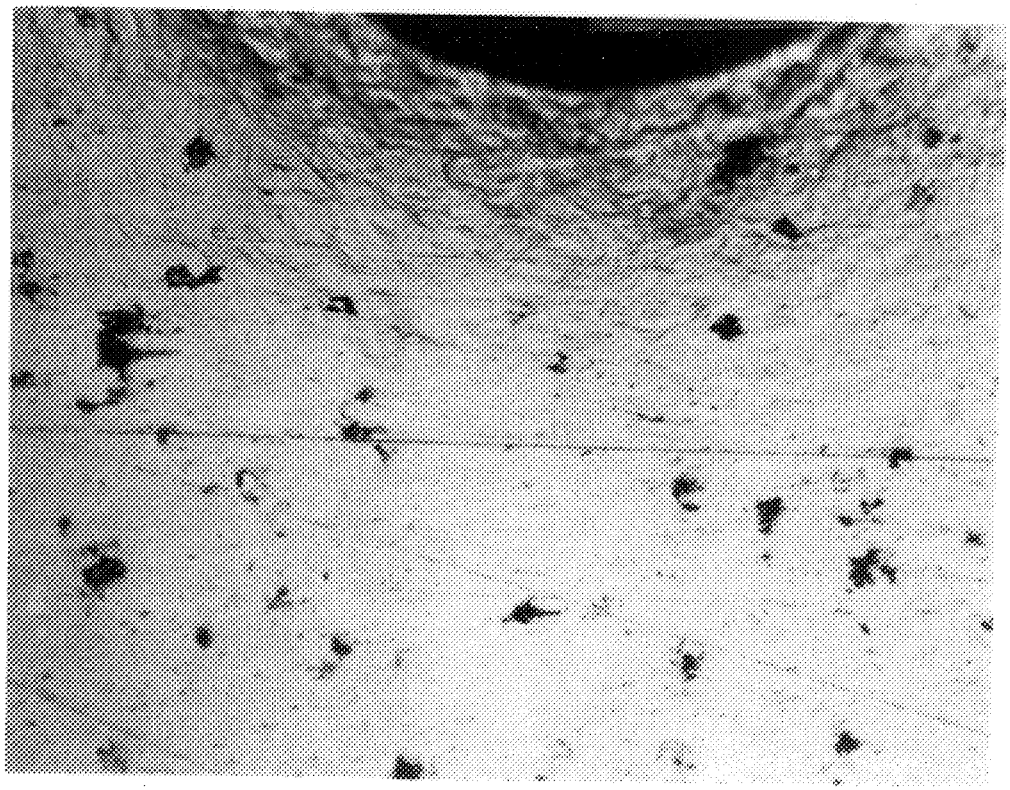
FIG. 5(a) and 5(b) are microscopic photographs showing the texture of the mirror-polished surface before and after treatment with nitric acid, respectively.

The present invention is applicable to regenerate an extrusion die for ceramic honeycomb structural bodies, wherein the extrusion die comprises a base metal and a hard coating of an abrasion-resistant material formed on a surface of the base metal, which is comprised of titanium as a major component, as shown in FIG. 4(a). According to the present invention, when the extrusion die has worn after practical use for substantial period, as shown in FIG. 4(b), it is removed from the extruder and immersed in a solution of nitric acid. By this, a residual part of the hard coating can be completely removed from the surface of the base metal of the die, as shown in FIG. 4(c). In this instance, the solution of nitric acid may be at a normal temperature, having a nitric acid concentration which is preferably within a range of approximately 60–70%.

When the nitric acid concentration is lower than 60%, it becomes difficult effectively to remove the residual part of the previous hard coating. On the other hand, when the nitric acid concentration is higher than 70%, there arises a tendency that the base metal itself is eroded. The length of time required to maintain the extrusion die in the nitric acid solution depends upon the thickness of the hard coating to be removed. In the case of a hard coating having a thickness of 15 $\mu$m, for example, it is generally appropriate to immerse the extrusion die in the nitric acid solution for approximately 100 hours.

As will be more particularly explained hereinafter, the hard coating comprising titanium as a major component can also be removed from the base metal surface by hydrofluoric acid or its mixture with nitric acid, though these acids are not very appropriate because they tend to erode the base metal of the die even when it is comprised of stainless steel. Erosion of the base metal can be avoided by using formic acid or phosphoric acid which, however, do not allow the hard coating to be effectively removed from the base metal surface.

After the hard coating comprised of titanium as a major component has been completely removed from the base metal surface of the die in the manner explained above, the die is sufficiently washed with water and then a fresh hard coating is applied which comprises titanium as a major component, for example, by a hot chemical vapor deposition process. To this end, as fully described in the above-mentioned JP-A-3-281,306 and JP-A-5-269,719 (or U.S. Pat. No. 5,256,449), the extrusion die is set in a chamber of a CVD device. The deposition is carried out using hydrogen gas as a carrier gas, and titanium tetrachloride or acetonitrile as a raw material gas, for the duration of approximately 10 hours under a temperature within a range of 680°–900° C. Instead of titanium tetrachloride, there may be used amine, hydrazine or nitrile as reaction gas. Also, instead of acetonitrile, there may be used trimethylamine, dimethyl-hydrazine or hydrogen cyanide as a C—N source.

As a result, a fresh hard coating comprising titanium as a major component is formed on the base metal surface of the extrusion die, as shown in FIG. 4(d). The extrusion die with a regenerated hard coating is then subjected to a pattern adjustment to complete a regenerated die. In the course of this pattern adjustment, as mentioned above, the surface of the fresh hard coating is locally ground so that the sliding resistance of the raw ceramic material along the feeding hole 1 and the shaping orifice 3 becomes uniform over the entire region of the die. On such an occasion, because the entirety of the fresh hard coating is newly formed on the base metal surface of the extrusion die with the feeding holes and shaping orifices formed therein, as shown in FIGS. 4(a), 4(b), 4(c) and 4(d), the surface of the fresh hard coating is relatively rough and can be readily ground. Therefore, according to the present invention, it is possible to achieve a markedly improved yield of the regenerated extrusion dies notwithstanding the pattern adjustment.

The present invention will be further explained below with reference to specific examples which illustrate the desirability of various conditions required for the regeneration method according to the present invention.

EXAMPLE 1

Figure 5B:
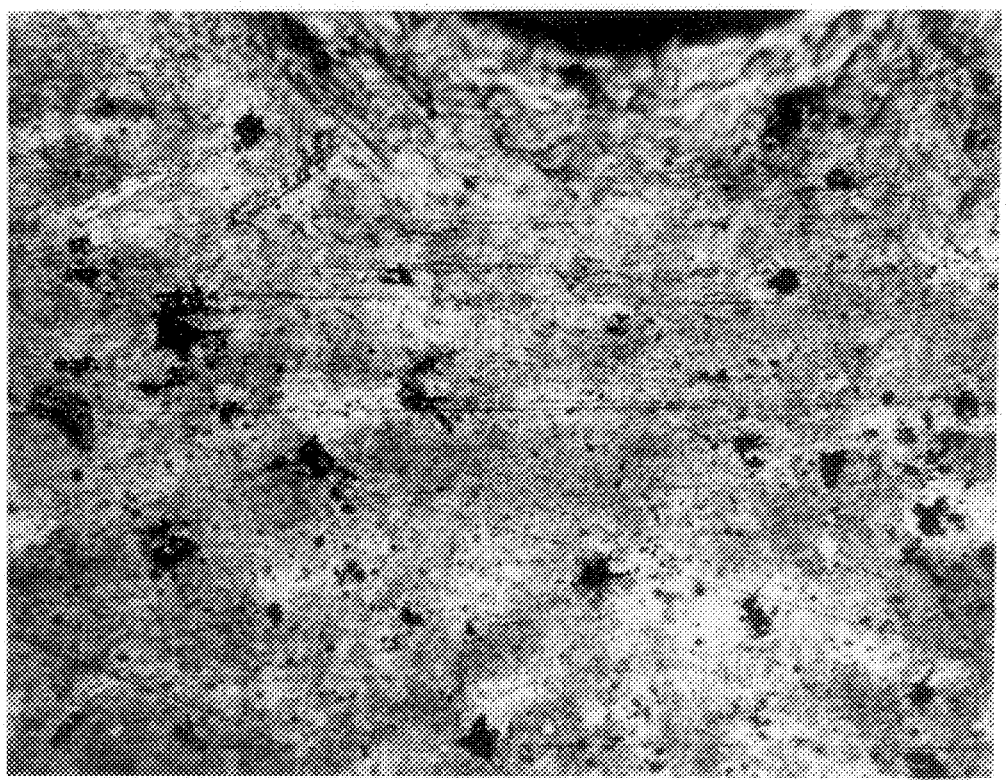
Figure 6A:
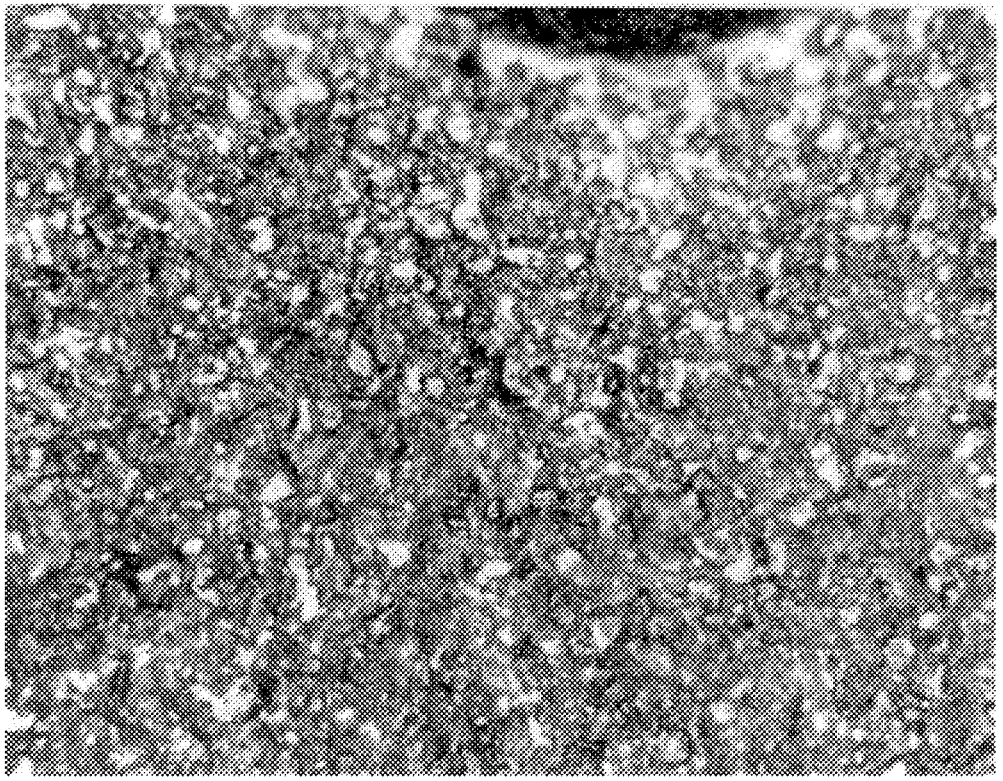
FIG. 6(a) and 6(b) are microscopic photographs showing the texture of the electric-discharge-machined surface before and after treatment with nitric acid, respectively.
Figure 6B:
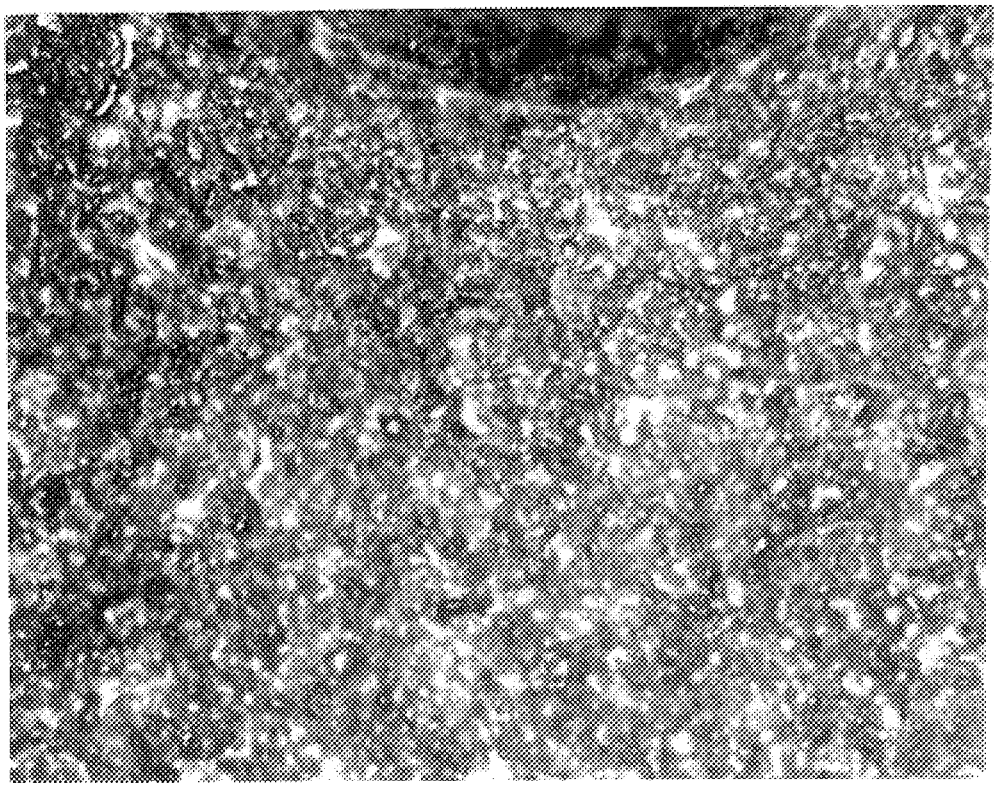
Figure 7A:
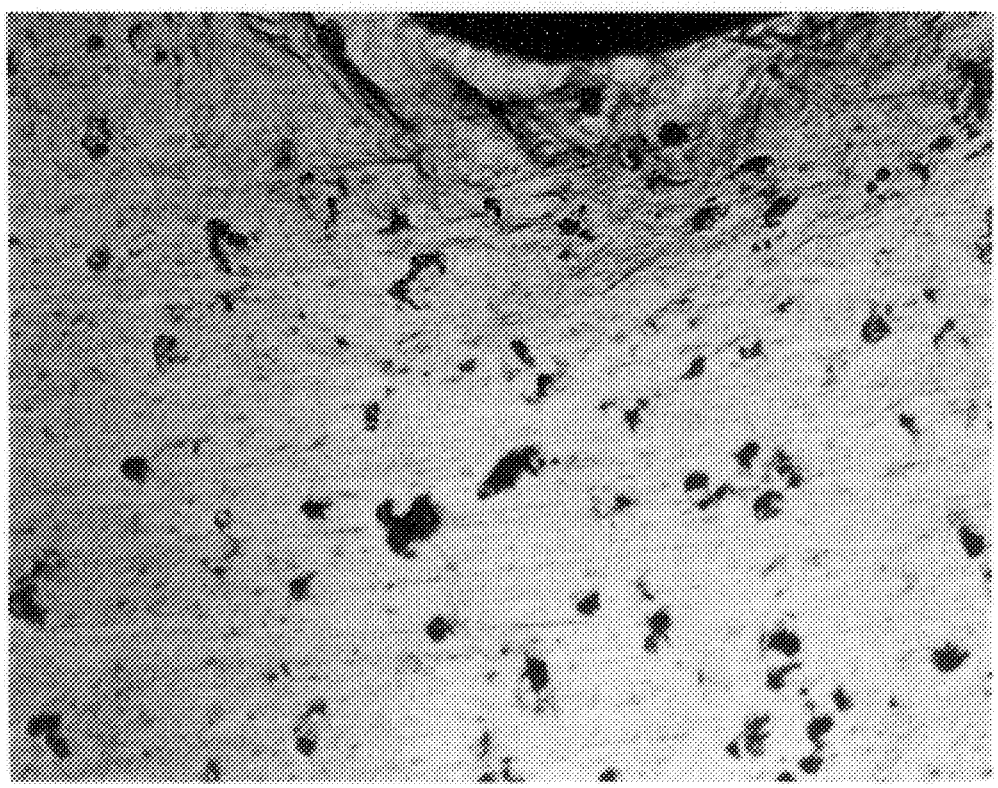
FIG. 7(a) and 7(b) are microscopic photographs showing the texture of the mirror-polished surface before and after treatment with the mixture of nitric acid and hydrofluoric acid, respectively.
Figure 7B:
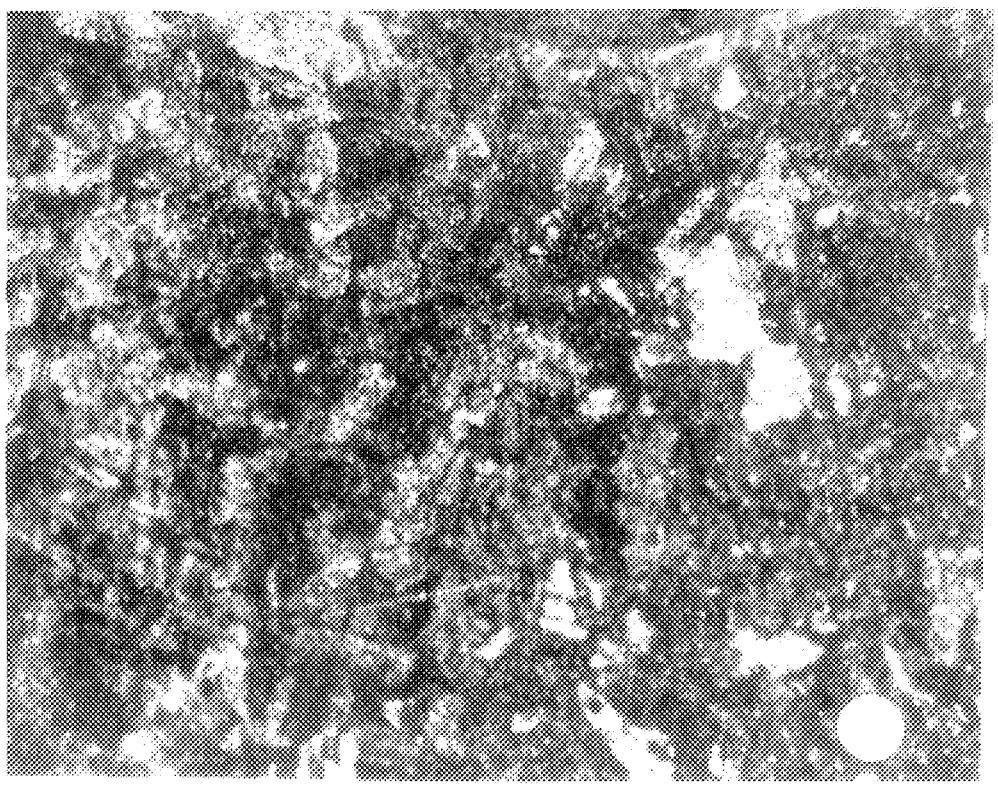
Figure 8A:
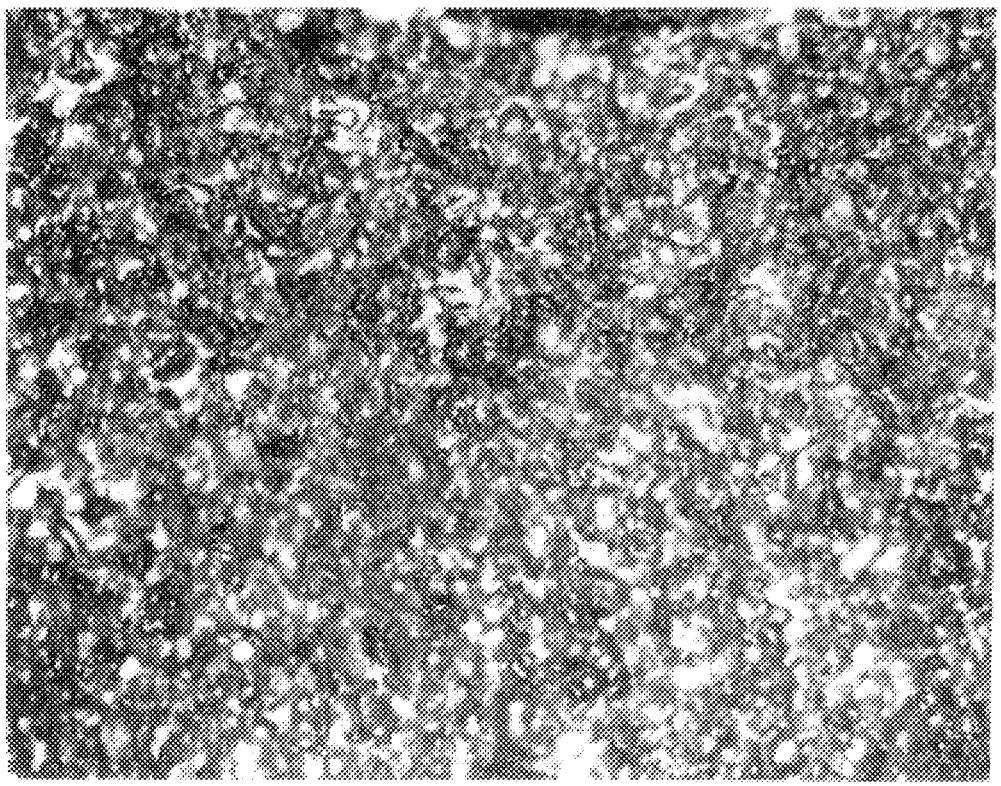
FIG. 8(a) and 8(b) are microscopic photographs showing the texture of the electric-discharge-machined surface before and after treatment with the mixture of nitric acid and hydrofluoric acid, respectively.
Figure 8B:
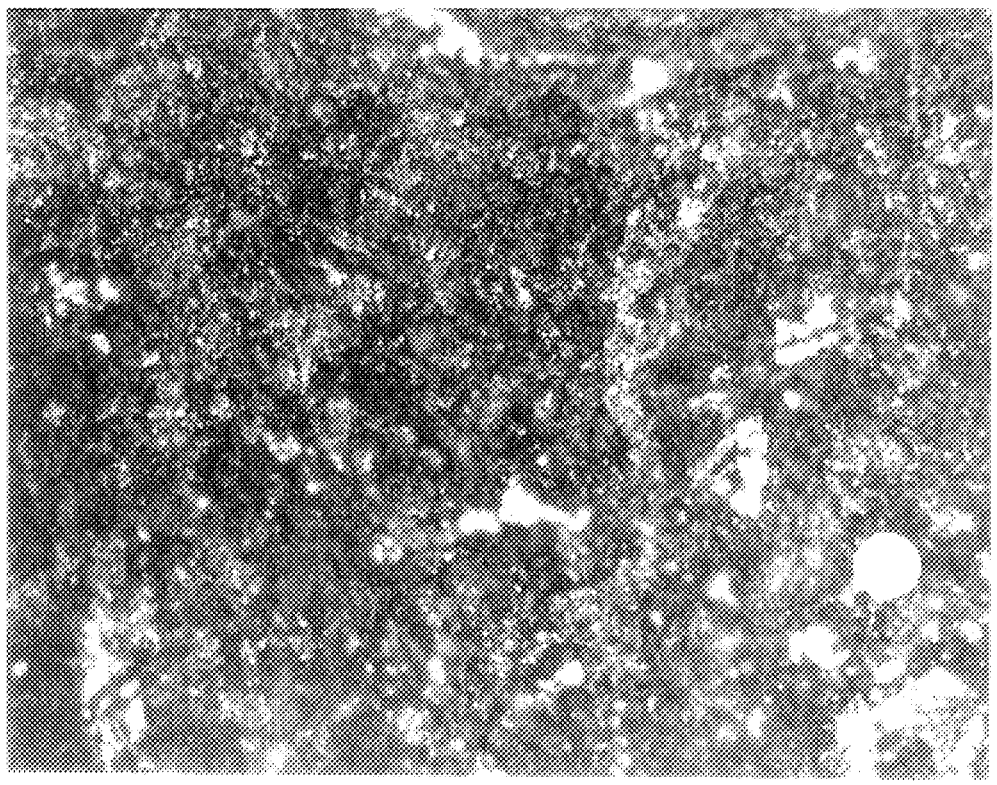
Figure 9A:
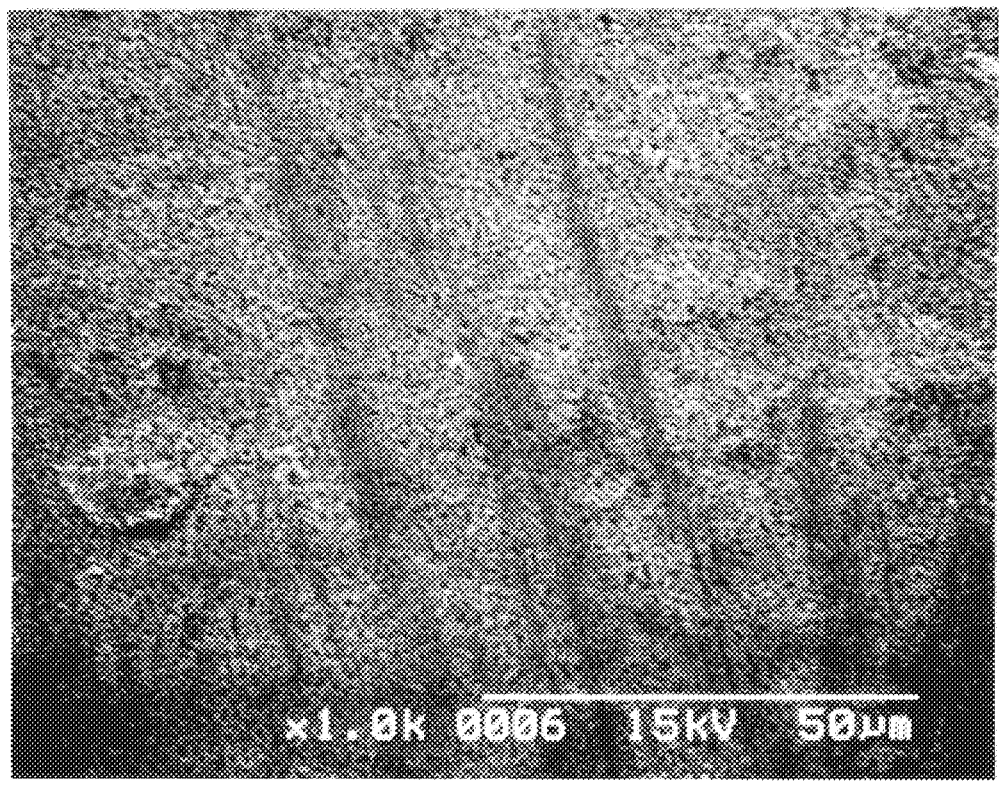
FIG. 9(a) and 9(b) are microscopic photographs showing the texture of the mirror-polished surface before and after treatment with phosphoric acid, respectively.
Figure 9B:
Figure 10A:
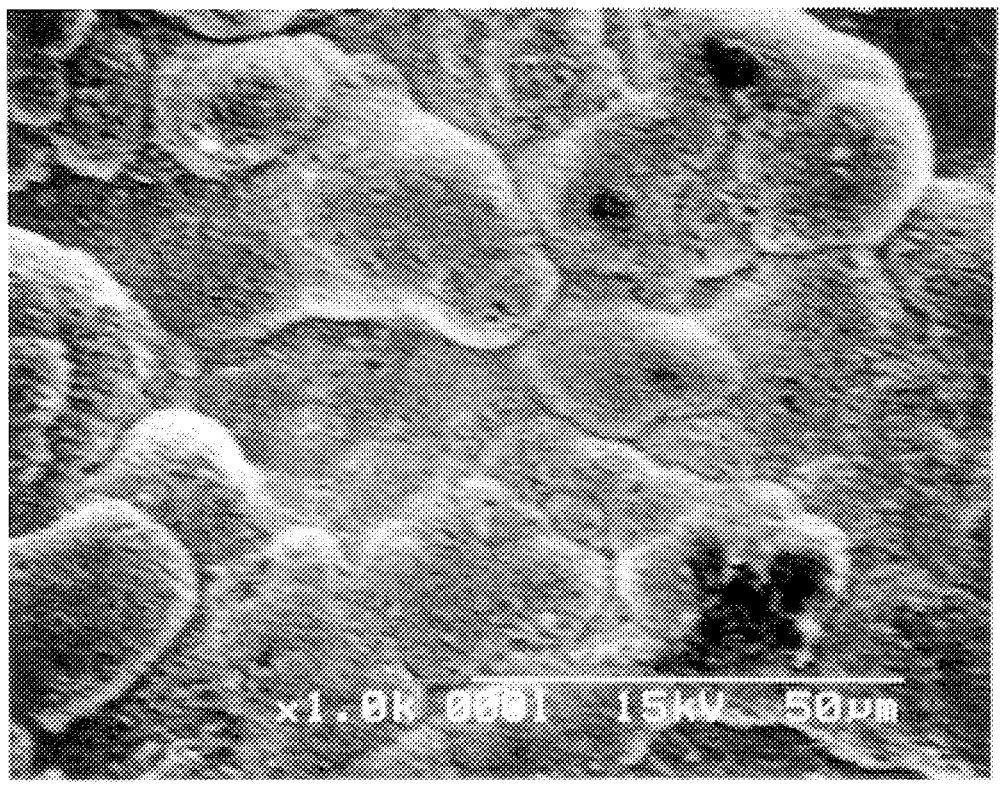
FIG. 10(a) and 10(b) are microscopic photographs showing the texture of the electric-discharge-machined surface before and after treatment with phosphoric acid, respectively.
Figure 10B:
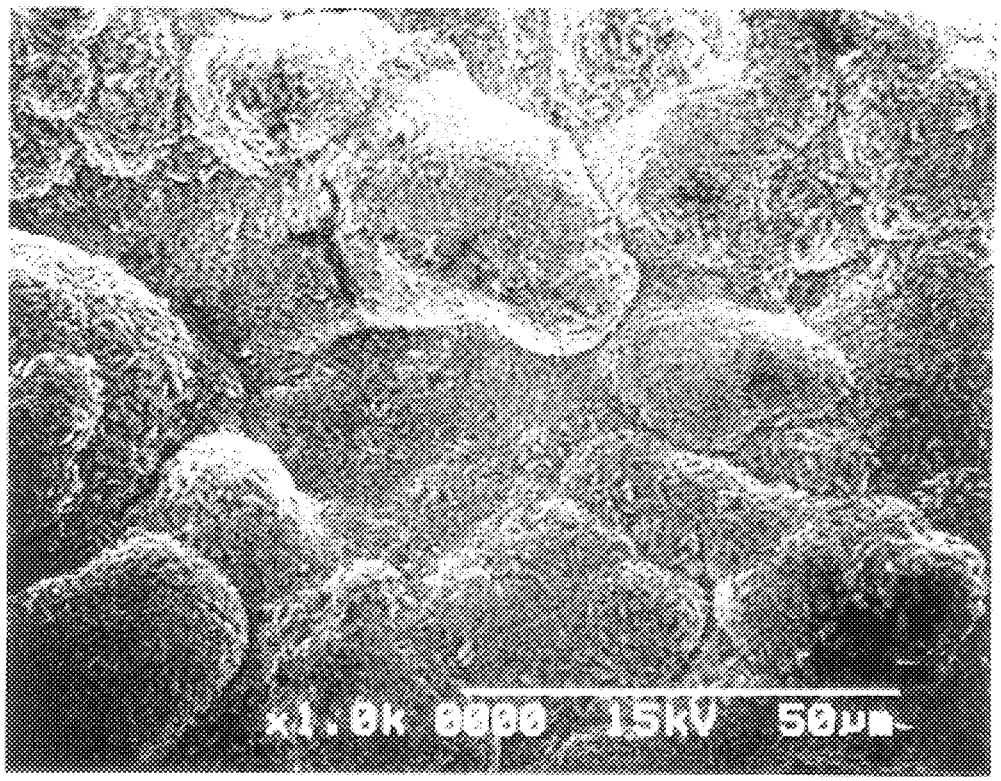
Figure 11A:
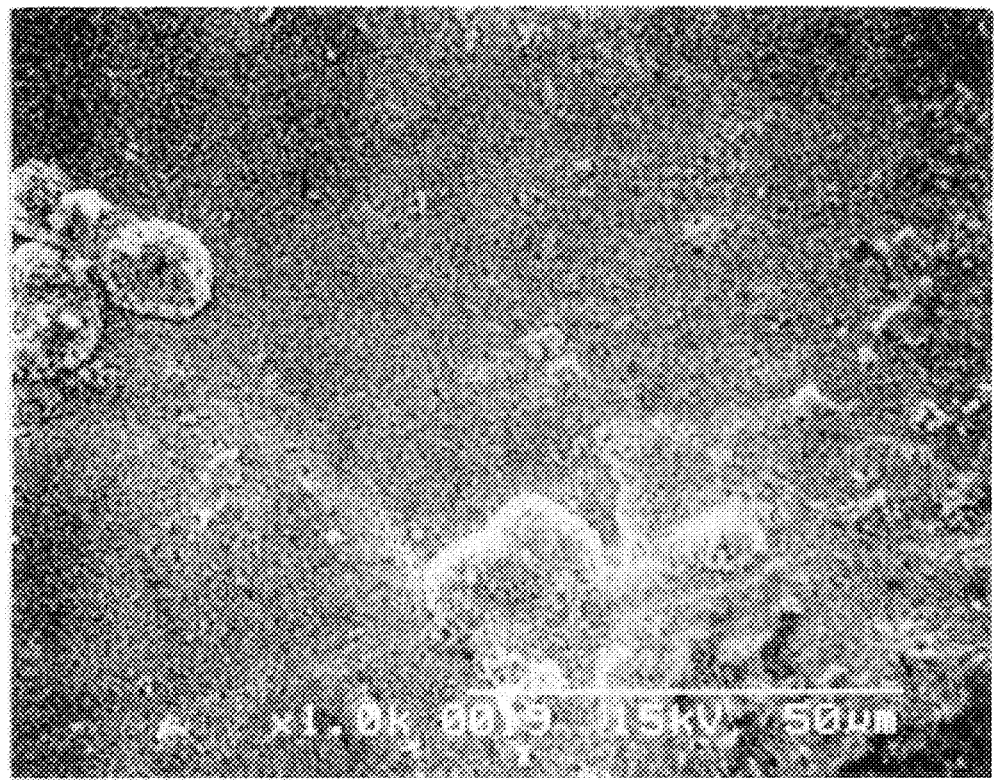
FIG. 11(a) and 11(b) are microscopic photographs showing the texture of the mirror-polished surface before and after treatment with formic acid, respectively.
Figure 11B:
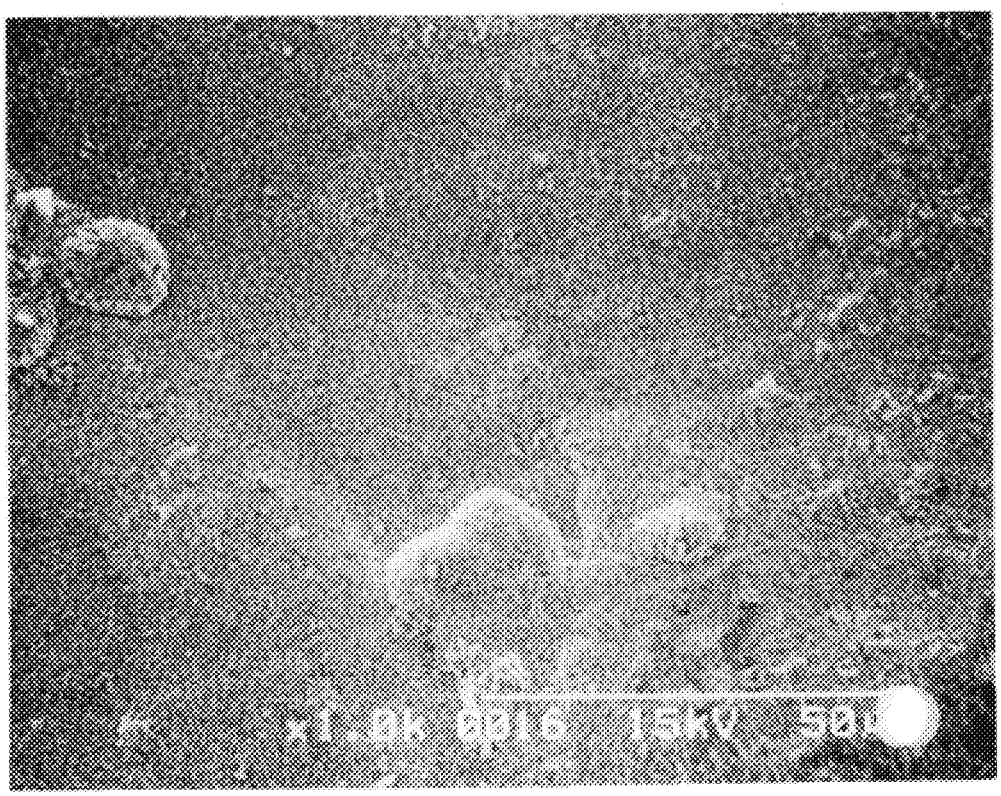
Figure 12A:
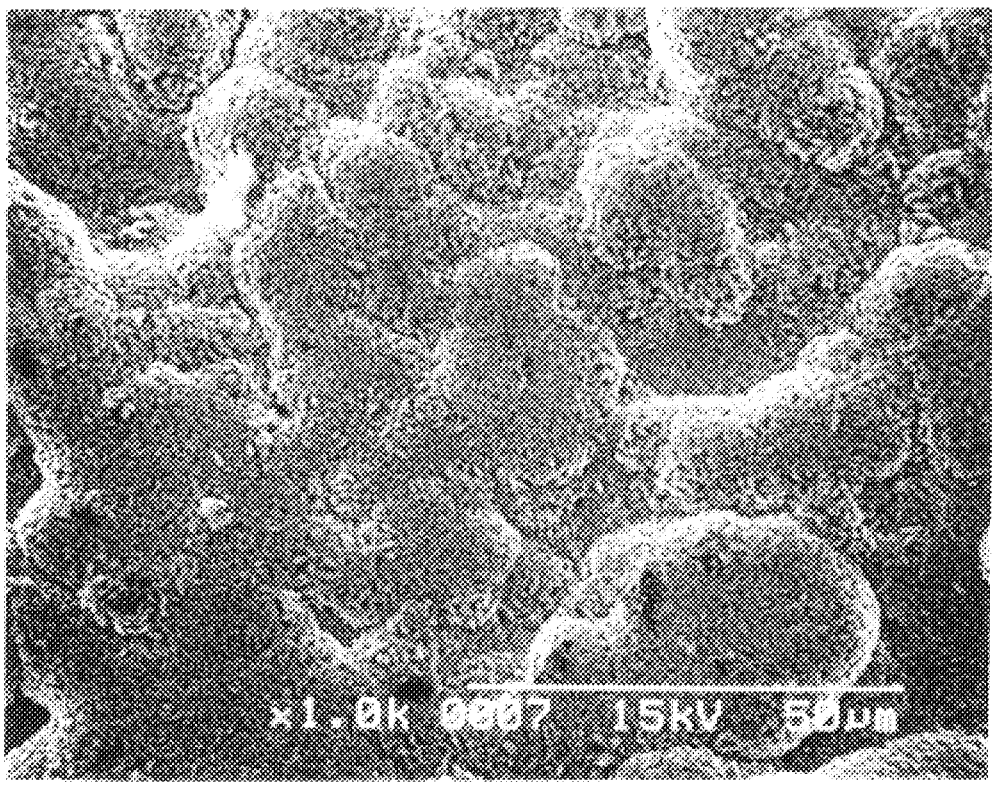
FIG. 12(a) and 12(b) are microscopic photographs showing the texture of the electric-discharge-machined surface before and after treatment with formic acid, respectively.
Figure 12B:
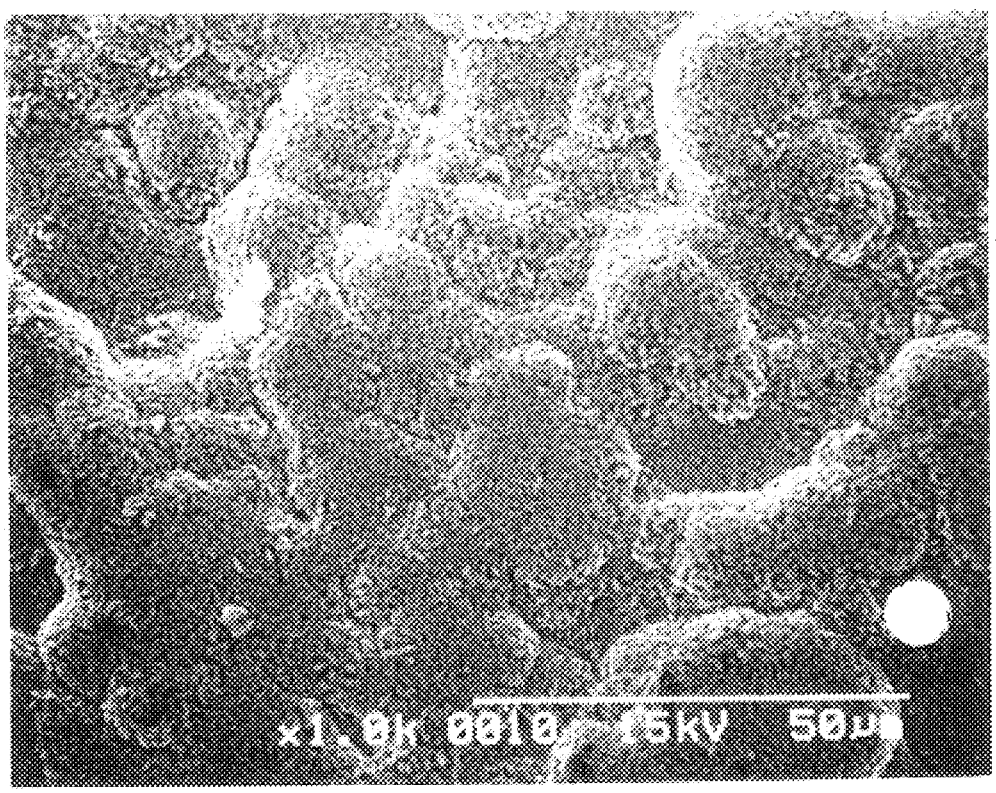

Testpieces were prepared each including a base metal consisting of a precipitation-hardened stainless steel having a surface which is formed with TiCN coating. These testpieces were immersed in solution of four kinds of acid, i.e., (i) nitric acid, (ii) mixture of nitric acid and 5% hydrofluoric acid, (iii) phosphoric acid and (iv) formic acid, and observations were carried out with respect to such testpieces to ascertain changes in weight of the coating, changes in surface roughness of the mirror-polished and electric-discharge-machined surfaces, and changes in thickness of the coating. The texture of the base metal surface before and after treatment with various acids can be recognized from the microscopic photographs which are shown in FIG. 5(a) through FIG. 12(b). The result of the above-mentioned observations are compiled in Table 1 below. It can be clearly appreciated that, unlike other acids, use of nitric acid is highly effective to remove the coating without eroding the base metal.

Incidentally, "electric-discharge-machined surface" as mentioned in Table 1 refers to the inner peripheral surface of the shaping orifice which has been machined by an electric discharge process. Also, "mirror-polished surface" mentioned in Table 1 refers to the inner peripheral surface of the shaping orifice which has worn into a highly smooth surface, as a result of abrasion through pressure-contact with the raw ceramic material during long use of the die, as if it had been machined by a mirror polishing process.

ceramic honeycomb structural bodies, which comprises a base metal consisting of a martensite series precipitation-hardened stainless steel which is produced by Hitachi Metals Co., Ltd., Japan, and available on market under the trade name "PSL", as well as a TiCN hard coating formed on the surface of the base metal by a hot CVD process to have an average thickness of 15 µm. When the extrusion die reached the final stage of its serviceable life, the die was removed from the extruder and immersed in a solution of nitric acid for 100 hours wherein the solution was maintained under a normal temperature and had a nitric acid concentration of 60%. As a result, it was confirmed that the TiCN coating had been completely removed from the surface of the base metal. Subsequently, the extrusion die was set in a chamber of a standard type hot CVD device produced by Benelux Company, and maintained at 800° C. for 10 hours to form a fresh TiCN coating. In this instance, hydrogen gas was used as a carrier gas, and titanium tetrachloride and acetonitrile were used as raw material gas. By this, a fresh TiCN coating having an average thickness of 15 µm was formed on the surface of the base metal. A pattern adjustment of the die was then carried out by locally grinding the surface of the die so that the sliding resistance of the raw ceramic material becomes substantially uniform over the entire region of the die. This adjustment could be performed without encountering the problem of machining difficulty.

As a result of regeneration of a number of extrusion dies by the method according to the present invention, it has been confirmed that the regenerated dies could be practically used

TABLE 1

| | Weight | | | Surface Roughness Ra | | | | | | | | |
|---|---|---|---|---|---|---|---|---|---|---|---|---|
| | | | | Electric-Discharge-Machined Surface | | Mirror-Polished Surface | | | | | | |
| Treating Acid | Initial Weight | Variation after Formation of Coating | Variation after Removal of Coating | Initial Roughness | Roughness after Removal of Coating | Initial Roughness | Roughness after removal of Coating | Thickness of Coating | Immersing Time | Thickness of Coating After Acid Treatment | Remarks | Photographs | Evaluation |
| Nitric Acid | 27.955 g | +0.051 | 0.000 | 13.4 µm | 12.5 | 0.65 µm | 0.5 | 6.7 µm | 100 h | 0 µm | Coating completely removed without erosion of base metal | FIGS. 5(a), 5(b), 6(a), 6(b) | Acceptable |
| Mixture of Nitric Acid and Hydrofluoric Acid | 27.961 g | | −0.141 | 12.8 µm | 12.4 | 1.73 µm | 6.3 | 8.1 µm | 8 h | 0 µm | Coating removed with erosion of base metal | FIGS. 7(a), 7(b), 8(a), 8(b) | Unacceptable |
| Phosphoric Acid | 27.963 g | +0.047 | +0.047 | 14.3 µm | — | 1.5 µm | — | 5.8 µm | 95 h | 5.8 µm | Coating not removed | FIGS. 9(a), 9(b), 10(a), 10(b) | Unacceptable |
| Formic Acid | 27.926 g | +0.034 | +0.033 | 13.7 µm | — | 1.18 µm | — | 5.7 µm | 93 h | 5.7 µm | Coating not removed | FIGS. 11(a), 11(b), 12(a), 12(b) | Unacceptable |

EXAMPLE 2

In this example, the method according to the present invention has been applied to regenerate an extrusion die for to extrude ceramic honeycomb structural bodies in the same manner as a new extrusion die. None of the extrusion dies exhibited any surface defect due to the pattern adjustment.

Thus, ceramic honeycomb structural bodies extruded from the regenerated dies proved to satisfy a critical standard for the dimensional accuracy, without any undesirable curvature.

It will be readily appreciated from the foregoing description that the present invention provides an improved method for regenerating extrusion dies for ceramic honeycomb structural bodies, wherein a titanium-based hard coating is removed by using nitric acid without eroding the base metal, and a fresh hard coating is formed and a pattern adjustment of the die is then carried out. It is thus possible effectively and reliably to prevent occurrence of surface defect of the die which may otherwise be caused due to the pattern adjustment. The present invention thus achieves a marked improvement in the regeneration yield of the die.

While the present invention has been explained above with reference to specific examples, it is of course that various modifications and alterations may be made without departing from the scope of the invention as defined by the appended claims.

What is claimed is:

1. A method for regenerating an extrusion die for ceramic honeycomb structural bodies, the extrusion die including a base metal and a titanium-containing abrasion-resistant coating formed on a surface of the base metal, wherein said method comprises the sequential steps of:

immersing the extrusion die in a solution of nitric acid after the die has worn, to remove a residue of the abrasion-resistant coating from the surface of the base metal;

forming a fresh abrasion-resistant coating on the surface of the base metal, the fresh abrasion-resistant coating comprising titanium; and machining the fresh abrasion-resistant coating to adjust a pattern of the die.

2. The method according to claim 1, wherein said fresh abrasion-resistant coating comprises at least one layer which consists of a member selected from the group consisting of TiC, TiCN and TiN.

3. The method according to claim 2, wherein said fresh abrasion-resistant coating is formed by a chemical vapor deposition process.

4. The method according to claim 1, wherein said base metal comprises a precipitation-hardened stainless steel, and said solution has a nitric acid concentration which is within a range of 60–70 wt %.

* * * * *